United States Patent [19]

Koh

[11] Patent Number: 5,032,739
[45] Date of Patent: Jul. 16, 1991

[54] INPUT SELECTION CIRCUIT USING A PLURALITY OF BIDIRECTIONAL ANALOGUE SWITCHES

[75] Inventor: Young-san Koh, Suwon, Rep. of Korea

[73] Assignee: SamSung Electronics Co., Ltd., Suwon, Rep. of Korea

[21] Appl. No.: 353,483

[22] Filed: May 18, 1989

[30] Foreign Application Priority Data

May 18, 1988 [KR] Rep. of Korea ............... 7361/88[U]

[51] Int. Cl.$^5$ ............................................ H03K 17/56
[52] U.S. Cl. ...................................... 307/243; 307/562
[58] Field of Search ............... 307/242, 243, 559, 562, 307/563; 330/51

[56] References Cited

U.S. PATENT DOCUMENTS

| | | | |
|---|---|---|---|
| 3,760,287 | 9/1973 | Harris | 330/51 |
| 3,760,289 | 9/1973 | Hurtig, III | 330/51 |
| 3,781,912 | 12/1973 | McCollum, Jr. | 330/51 |
| 4,636,738 | 1/1987 | Westwick et al. | 330/51 |
| 4,760,346 | 7/1988 | Kultgen et al. | 330/51 |

FOREIGN PATENT DOCUMENTS

| | | |
|---|---|---|
| 3033699 | 4/1983 | Fed. Rep. of Germany . |
| 0092028 | 7/1980 | Japan ................... 307/243 |
| 0902256 | 1/1982 | U.S.S.R. ............... 307/243 |

OTHER PUBLICATIONS

Austin et al.; Electronic Engineering; Oct. 87; pp. 67, 71, 72 and 75.
Matsushita; Patent Abstracts of Japan; Sect. E, vol. 4 (1980), No. 181 (E-37).

Primary Examiner—Stanley D. Miller
Assistant Examiner—T. Cunningham
Attorney, Agent, or Firm—Robert E. Bushnell

[57] ABSTRACT

An input selection circuit using a plurality of bidirectional analogue switches disclosed which is constituted such that a feedback circuit is installed between the input terminals of a bidirectional analogue switch device and the output terminal of an amplifier, characterized in that the directional conduction deviations of bidirectional switches provided in the bidirectional switch device can be reduced during the transmission of signals. Therefore, the input selection circuit according to the present invention can reduce the signal distortions due to the directional conduction deviations.

6 Claims, 4 Drawing Sheets

INPUT SELECTION CIRCUIT USING A PLURALITY OF BIDIRECTIONAL ANALOGUE SWITCHES

FIELD OF THE INVENTION

The present invention relates to an input selection circuit using a plurality of bidirectional analogue switches for selecting the input signal source correspondingly with the selecting mode in composite electronic appliances such as Audio/Video systems, and particularly to an input selection circuit which utilizes the feedback scheme to reduce the signal distortion generated when a directional conduction deviation exists during the transmission of signals through the bidirectional analogue switches.

BACKGROUND OF THE INVENTION

Generally, the input selection circuit adopted in the selector of a composite electronic appliance such as a multiplayer is constituted as shown in FIG. 1, and is operated as described below. Upon supplying of control signals CA, CB from a microcomputer (not shown) as a controller to a switching controller 1 of the input selection circuit, the switching controller 1 decodes two control signals and selects a desired analogue switch from a plurality of bidirectional switches which are provided in a bidirectional switch device 2.

Thus, if a bidirectional analogue switch is selected by decoded control signals, then an analogue output signal of the signal source coupled to the selected bidirectional analogue switch among a plurality of signal sources VS1-VSn, will be outputted through an amplifier 3.

The above procedure of operation will be described in more detail by referring to FIG. 2 where an equivalent circuit for the circuit of FIG. 1 is illustrated. In FIG. 2, the one side terminals x1-xn of a plurality of bidirectional switches SW1-SWn provided in the bidirectional switch device 2 will be indicated by X, and the other side terminals y1-yn thereof will be indicated by Y. When the current outputted from the signal sources VSL-VSn flows in a direction from X to Y of the bidirectional switches SW1-SWn, the on-current resistance of the switches SW1-SWn will be represented by R(Y/X), and on the other hand, when the current flows from Y to X, the on-current resistance will be indicated by R(Y/X). Then a case of R(Y/X)≠R(Y/X) will occur due to the existence of a directional conduction deviation generated by the internal resistances IR of the switches SW1-SWn. Therefore, the input/output voltage characteristics will become non-linear, i.e. T1≠T2, as shown in FIG. 3 due to the existence of the directional conduction deviation of the switches SW1-SWn, thereby causing a distortion during the transmission of signals. The signal distortion due to the existence of the directional conduction deviation of the switches SW1-SWn can be calculated by the following formulas which are based on the feedback theory.

$$T(S) = \frac{G(S)}{1 + G(S) \cdot H(S)} \quad (1)$$

where
T(S) represents the total transfer function,
G(S) the transfer function, and
H(S) the feedback function.

Also when $G(S) \cdot H(S) \gg 1$, T(S) will be given as follows;

$$T(S) \approx \frac{1}{H(S)} \quad (2)$$

Based on the above formulas, if it is assumed that the current flows in a direction from X to Y of the switches SW1-SWn, then the following formula is obtained:

$$T(S) = -\frac{RP}{RS - R\frac{Y}{X} - RI}$$

On the other hand, if it is assumed that the current flows from Y to X of the switches SW1-SWn, then the following formula is obtained;

$$T(S) = \frac{-RP}{RS - R\frac{X}{Y} - RI}$$

where RS represents RS1, RS2 ... or RSn, and RI represents R1, R2 ... or Rn. Meanwhile, the sensitivity function $$\left( S \frac{T}{H} \right)$$

which represents the ratio of the variation rate of T(S) to the variation rate of H(S), $$\frac{dT/T}{dH/H}.$$

can be given as follows:

$$S\frac{T}{H} = \frac{G(S) \cdot H(S)}{1 + G(S) \cdot H(S)} \quad (3)$$

As is apparent from the above formula (3), the closed loop gain of the bidirectional switches SW1-SWn against the variation of H(S) is very large. Therefore, if a sinusoidal wave input signal originated from the ground potential is fed from the signal sources VS1-VSn to the bidirectional switches SW1-SWn, then there arises a problem that the signal outputted from the amplifier 3 of FIG. 2 becomes unsymmetrical.

SUMMARY OF THE INVENTION

The present invention is intended to overcome the above disadvantages of the conventional circuit.

Therefore it is an object of the present invention to provide an input selection circuit which can reduce the distortion due to the directional conduction deviation of the bidirectional analogue switches during the transmission of the output signals of the signal source selected by one of a plurality of bidirectional analogue switches.

It is another object of the present invention to provide an input selection circuit which can minimize the directional conduction deviation during the signal transmission by differentiating, by control signals, the operations of two analogue switches respectively provided in the bidirectional switch device.

In achieving the above objects, the circuit of the present invention is constituted such that a feedback device is installed between the input terminal of a bidirectional switch device and the output terminal of an amplifier, said bidirectional switch device being for selecting, by a control signal, one of a plurality of analogue output signals with different levels from a signal source, and said amplifier being for amplifying the analogue signal selected by the bidirectional switch device. The circuit of the present invention thus constituted has a feature that the directional conduction deviation of the plural bidirectional switches within the bidirectional switch device can be reduced.

BRIEF DESCRIPTION OF THE DRAWINGS

The above objects and other advantages of the present invention will become more apparent by describing the preferred embodiments of the present invention with reference to the attached drawings in which.

DESCRIPTION OF THE PREFERRED EMBODIMENT

Figure 1:
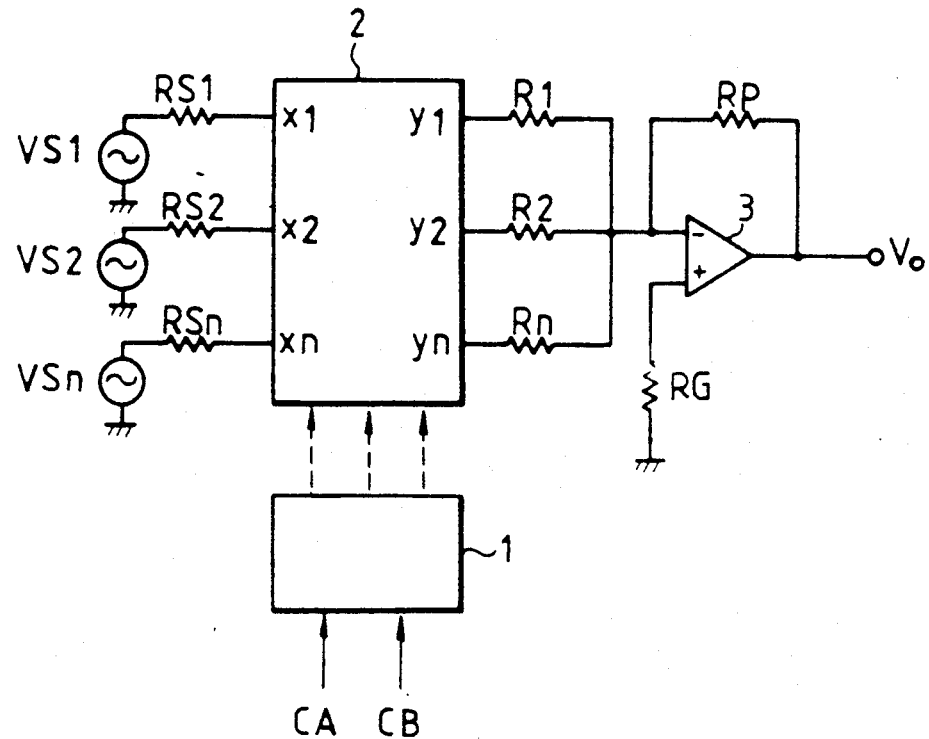
FIG. 1 illustrates the input selection circuit of a conventional technology using a plurality of bidirectional analogue switches.
Figure 2:
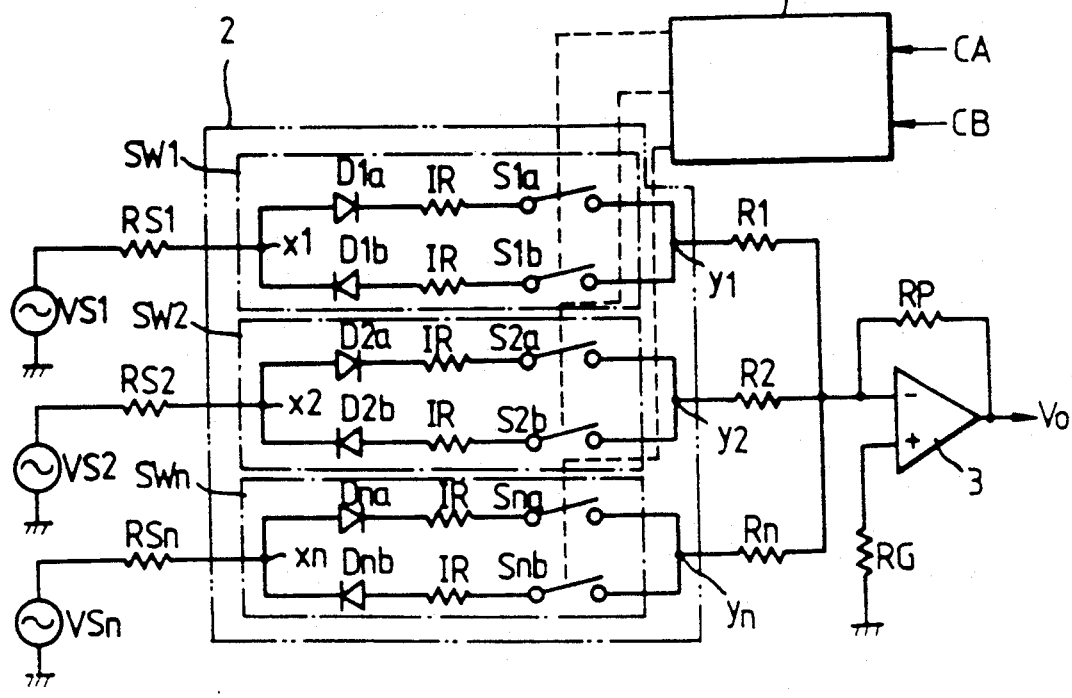
FIG. 2 illustrates an equivalent circuit for the bidirectional switches of the conventional input selection circuit of FIG. 1.
Figure 3:
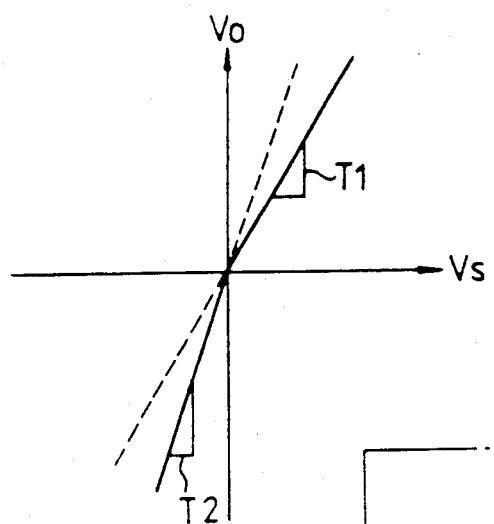
FIG. 3 is graphical illustration of the input/output voltage characteristics for the input selection circuit of FIG. 1.
Figure 4:
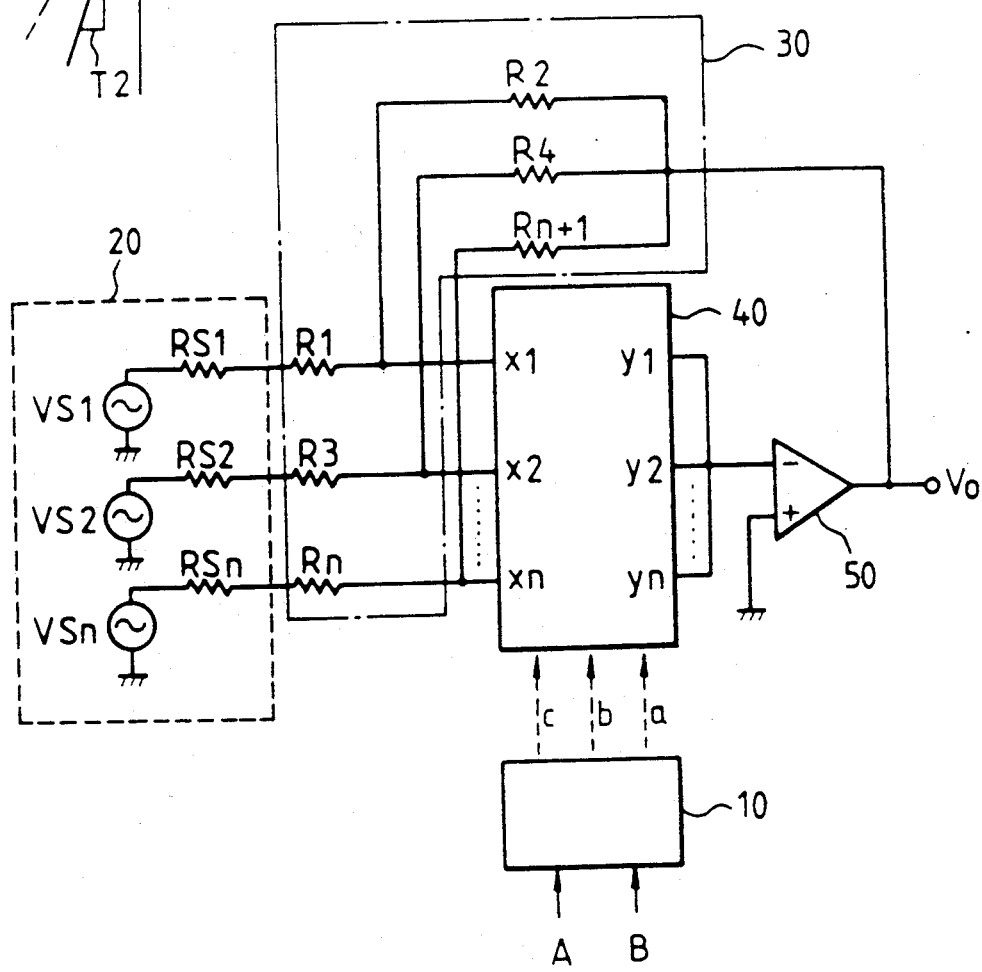
FIG. 4 illustrates the input selection circuit according to the present invention.

Referring to FIG. 4 in which the input selection circuit is illustrated, a bidirectional analogue switch device 40 includes a plurality of bidirectional analogue switches, and the operations of the bidirectional analogue switches are controlled by control signals A,B which are decoded by a switching controller 10.

The switching controller 10 decodes the control signals A,B which are supplied from a microcomputer (not shown), in order to control analogue switches provided in the bidirectional switch device 40. An amplifier 50 is commonly connected to the output terminals of the bidirectional switch device 40 in such a manner that the output signals should be inverted and amplified. A feedback device 30 consists of feedback resistances R1-Rn+1 which are connected between each input terminal of the bidirectional switch device 40 and the output terminal of the amplifier 50.

Before making descriptions on the operation of the input selection circuit according to the present invention, the relationship between the total transfer function of the input selection circuit and the transfer function of the bidirectional analogue switches will be described.

According to the theory of feedback, the total transfer function of the closed loop of the input selection circuit as shown in FIG. 4 is defined by Formula 1, and G(S) can be specified by Formula 4 as shown below.

$$G(S) = G1(S) \cdot G2(S) \tag{4}$$

where G1(S) represents the transfer function for the bidirectional analogue switch, and G2(S) represents an arbitrary transfer function.

If the value of G2(S) of Formula 4 is made to be very large, T(S) will be related only to the value of H(S) as is apparent by Formula 2 above.

Meanwhile the sensivity function $$\left( S \frac{T}{G1} \right)$$

which represents the ratio of the variation rate of T(S) to the variation rate of G1 is defined by the formula as shown below.

$$S \frac{T}{G1} = \frac{1}{1 + G1 \, G2 \, H} \tag{5}$$

As can be seen by Formula 5 above, if the value of G2 is large, the variation due to G1 can be disregarded. That is, as mentioned above, the input selection circuit according to the present invention is constituted such that the total transfer function T(S) should not be influenced by the sensitivity of the value of G1.

In the input selection circuit of FIG. 4 constituted based on the theoretical background as described above, if the control signals A,B are supplied to the switching controller 10, then the switching controller 10 decodes the control signals A, B to control the operations of the bidirectional analogue switches provided in the bidirectional switch device 40. Thus, upon actuating of the bidirectional analogue switches after decoding of the control signals A,B, an analogue signal will be selected among a plurality of analogue signals generated from signal sources 20, and the selected analogue signal will be supplied to the inverting input terminal (−) of the amplifier 50.

The analogue signal delivered to the amplifier 50 will be amplified and outputted to an output terminal Vo, and at the same time, will also be supplied to input terminals X1, X2 . . . , Xn of the bidirectional switch device 40 through feedback resistances R2, R4 . . . , Rn+1.

Figure 5:
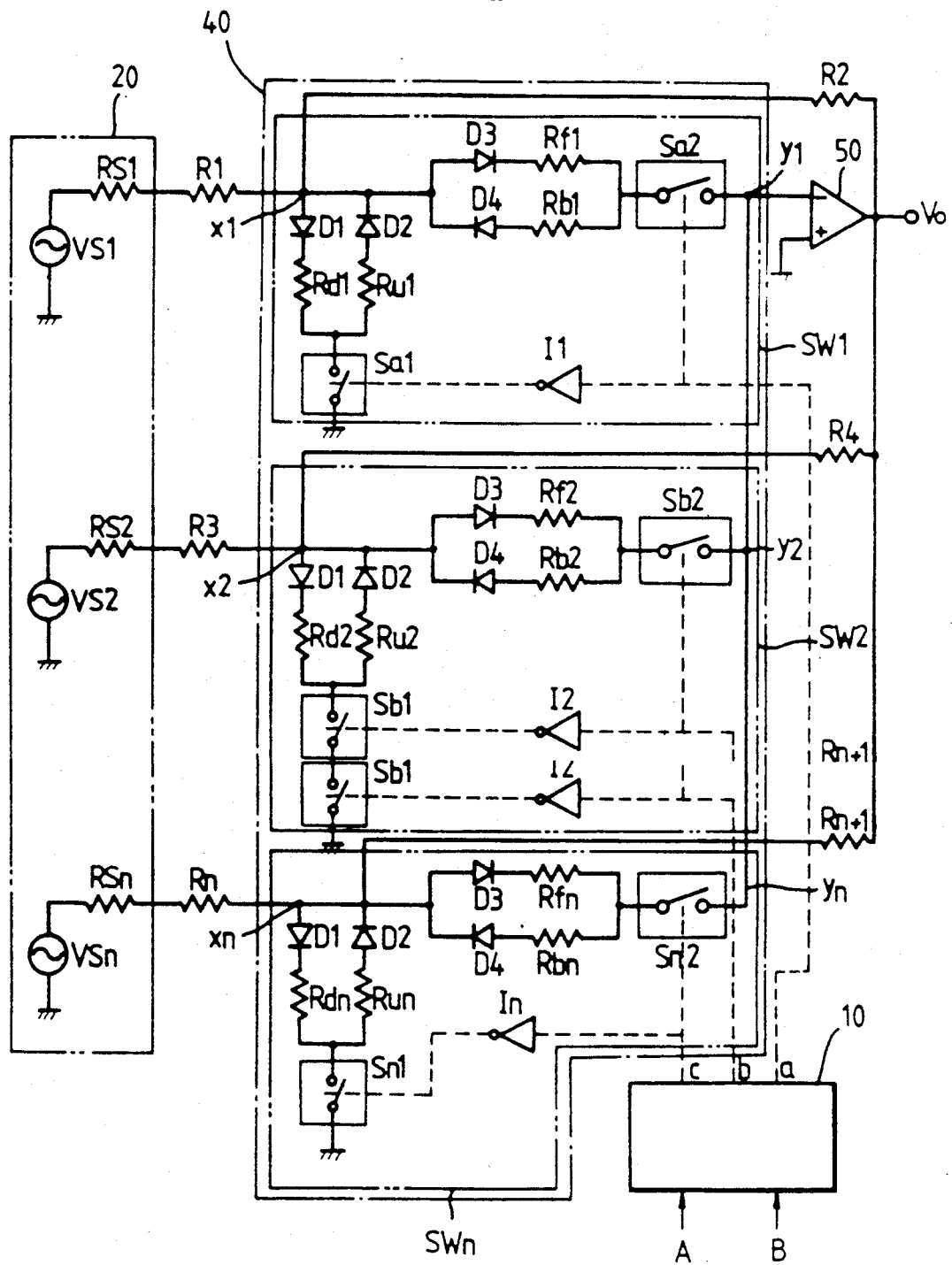
FIG. 5 illustrates an equivalent circuit for the input selection circuit of FIG. 4.

The input selection circuit operated as above will be further described in more detail as to its operations by referring to the equivalent circuit shown in FIG. 5. The bidirectional switch device 40 for use in the input selection circuit of the present invention includes a plurality of bidirectional switches SW1-SWn as shown in FIG. 5, and these bidirectional switches SW1-SWn have the same constitution each other. That is, each of these bidirectional switches SW1-SWn consists of two analogue switches Sa1, Sa2 for being actuated in contrary manners each other by the decoded control signals and diodes D1-D4 for determining the direction of conduction of the analogue switches Sa1, Sa2. Descriptions of the reference codes contained within the bidirectional switch device 40 are presented in Table 1 below.

TABLE 1

| | |
|---|---|
| D1,D2,D3,D4 | Ideal diodes the cut-in voltage of which is "O". |
| Rd1,Rd2,Rdn | Resistance for the current flowing through D1. |
| Ru1,Ru2,Run | Resistance for the current flowing through D2. |
| Rf1,Rf2,Rfn | Resistance for the current flowing through D3. |
| Rb1,Rb2,Rbn | Resistance for the current flowing through D4. |
| Sa, Sb, Sn | Analogue switches in which on-current resistances are "O". |

Meanwhile, the switching controller 10 used in the input selection circuit according to the present invention decodes two control signals A, B and the input-/output of the controller 10 is presented in Table 2 below.

TABLE 2

| Control input signals | | Decoded output | | |
|---|---|---|---|---|
| A | B | a | b | c |
| H | H | 1 | 0 | 0 |
| H | L | 0 | 1 | 0 |
| L | H | 0 | 0 | 1 |
| L | L | 0 | 0 | 0 |

As can be seen from the Table 2 above, if the control input signals A and B applied to the switching controller 10 hold "high" and "low", then the output terminal "b" of the switching controller 10 outputs a "high" signal, while the output terminals "a" and "c" produce "low" signals respectively.

Figure 6:
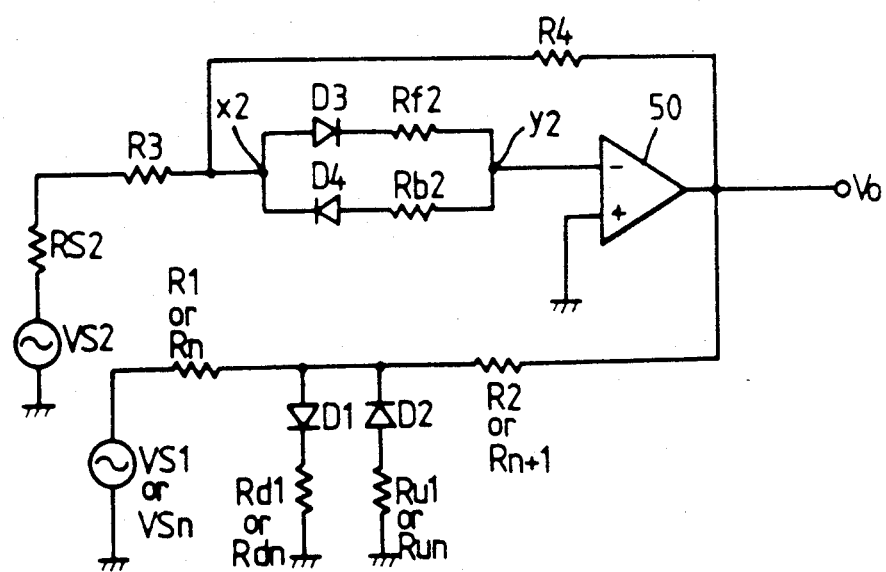
FIG. 6 illustrates an equivalent circuit for the input selection circuit of FIG. 5, taken at the moment when any one of the bidirectional switches is being operated.

Accordingly, the analogue switches Sa2, Sn2, Sb1 provided within the bidirectional switch device 40 of FIG. 5 are turned off, while the analogue switches Sa1, Sb2, Sn1 are turned on, with the result that the input selection circuit establishes an equivalent circuit as shown in FIG. 6.

FIG. 6 illustrates an equivalent circuit showing a state in which an input signal source VS2 within the signal source 20 of FIG. 5 is selected by the bidirectional switch device 40. Referring to the FIG. 6, if the analogue signal outputted from the input signal source VS2 is a positive (+) signal, the current will flow through the resistances RS2, R3 in a direction from X2 to Y2 of the switch SW2, with the result that the positive signal will be supplied through the diode D3 and the resistance Rf2 to the inverting terminal (−) of the amplifier 50, while, if a negative signal is outputted by the input signal source VS2, the current will flow from Y2 to X2, with the result that the negative signal will be supplied through the diode D4 and the resistance Rb2 to the inverting terminal (−) of the amplifier 50 to be amplified and outputted through an output terminal Vo.

Meanwhile, the analogue signal outputted from the input signal source VS1 is subjected to a first of voltage division by resistance R1,Rd1,Ru1, and in turn, is subjected to a second step of voltage division by the feedback resistance R2 and the output resistance Rof (in a closed loop), and then, is outputted to the output terminal Vo. Meanwhile, the analogue signal outputted from the input signal source VS_N is also subjected to the same steps of voltage divisions, and is also outputted to the output terminal Vo. But in this case, these voltages are disregarded by the respective predetermined resistance values in the form of $[R1(Rn)>>Rd1(Rdn), Ru1(Run)>>Rof\approx 0]$.

Therefore, the signal of the amplifier 50 is the one selected among the signals outputted by the signal source VS2, and is fedback through the feedback resistance R4 to the input terminal X2 of the bidirectional switch SW2.

Therefore, G(S) for the input selection circuit according to the present invention can be defined by Formula 6 as shown below based on T(S) of Formula 1.

$$G(S) = AV(S) \times \frac{R4}{R3 + R4} \times \frac{Ri}{Ri + Rf2 \cdot Rb2} \quad (6)$$

where AV(S) represents the gain, and Ri represents the input resistance toward the amplifier 50.

In formula (6) above, due to the influence of the resistances Rf2,Rb2, the sensitivity can be reduced by the amount of $-1/GH$ based on Formulas 3 and 5 compared with the conventional one.

Further, due to the formula $Ri>>Rf2(Rb2)>>G(S)>>1$, only the feedback function H(S) is influenced as in the case of Formula 2. That is, the influence of the resistances Rf2, Rb2 is almost negligible, and the signal outputted from the output terminal Vo is decided only by the feedback resistances R3,R4.

As described above, the input selection circuit according to the present invention makes it possible to reduce by the amount of 1/GH the signal distortion generated when a difference of a directional resistance exists in the switches during the transmission of the signals, so that a linear characteristic is achieved, and the products using the circuit of the present invention will display a high reliability. Further, as each of the input signal sources holds respective feedback functions, the gains can be designed for each of them. Therefore, if this input selection circuit is applied to apparatuses such as audio amplifier selectors, multiplayer selectors, video processor selectors, tuner band selections and the like, the advantage that the products can be diversified can be obtained.

What is claimed is:

1. An input selection circuit using a plurality of bidirectional analog switches, comprising:
   a switching stage having a plurality of pairs of analog switches, with a first analog switch in each of said pairs of analog switches and a corresponding second analog switch in each of said pairs of analog switches in said plurality to control signals for making a selection from among a plurality of input signals received from a plurality of signal sources, the selection being based on said control signals and providing said selected input signal to an output terminal of said switching stage;
   a plurality of pairs of diodes, each of said pairs of diodes being coupled via a corresponding one of said first and second analog switches in each of said pairs of analog switches, between a corresponding one of a plurality of input terminals of said switching stage and either a reference potential or said output terminal of said switching stage;
   amplifier means for amplifying of each the plurality of input signals selected by said first and second analog switches, whereby directional conduction deviations of said analog switches can be reduced during transmission of signals from said plurality of signal sources;
   feedback means coupled between each of said input terminals of said switching stage and an output port of said amplifier means;
   whereby having a first one of said first and second analog switches turned ON in any one of said plurality of pairs of analog switches couples a corresponding one of said plurality of input signals to said amplifier means and having a second one of said first and second analog switches turned ON, couples said corresponding one of said plurality of analog signals to said reference potential.

2. An input selection circuit, comprising:
   a switching controller, coupled to receive control signals, for decoding input control signals;
   a plurality of input terminals each coupled to receive a corresponding one of a plurality of analog signals;

amplifier means having a first input port, for amplifying the plurality of analog signals;

a plurality of first switches each having a first terminal coupled to said first input port of said amplifier means, said first switches being coupled to respond to the decoded input control signals and to transmit the plurality of analog signals to said first input port of said amplifier means in response to the decoded input control signals;

a plurality of second switches each having a first terminal coupled to a terminal for a reference potential, each of said second switches being coupled to the switching controller and to transmit corresponding ones of said plurality of analog signals to the reference potential in response to the decoded input control signals;

a plurality of first serially coupled resistor-diode branches;

a plurality of second serially coupled resistor-diode branches, each of said first resistor-diode branches being connected in parallel with a corresponding one of said second resistor-diode branches between a second terminal of a corresponding one of said plurality of first switches and a corresponding one of said plurality of input terminals, a diode of each of said first resistor-diode branches having a polarity opposite to a diode of the corresponding one of said second resistor-diode branches; and a plurality of third serially coupled resistor-diode branches;

a plurality of fourth serially coupled resistor-diode branches, each of said third resistor-diode branches being connected in parallel with a corresponding one of said fourth resistor-diode branches between a second terminal of corresponding one of said second plurality of switches and a corresponding one of said plurality of input terminals, a diode of each of said third resistor-diode branches having a polarity opposite to a diode of the corresponding one of said fourth resistor-diode branches; and feedback means coupled between each of said plurality of input terminals and an output port of said amplifier means for reducing conduction deviations between said plurality of input terminals and said output port during transmission of input signals.

3. A circuit as claimed in claim 2, wherein said first input port of said amplifier means is a negative input port.

4. A circuit as claimed in claim 3, wherein said feedback means comprises a plurality of feedback branches coupled to corresponding ones of said input terminals and to said output port of said amplifier means.

5. An input selection circuit, comprising:

a plurality of input terminals each coupled to receive a different one of a plurality of input signals;

amplifier means for amplifying selected ones of said plurality of input signals;

bidirectional switch means having input ports coupled to respond to decoded control signals and to receive the plurality of input signals from said input terminals, for selecting one of a plurality of the input signals based on the decoded control signals received, said bidirectional switch means comprising:

a plurality of first switches each having a first terminal coupled to a negative terminal of said amplifier means;

a plurality of second switches each having a first terminal connectable to a reference potential;

a plurality of first diode pairs, each of said first diode pairs being connected in parallel between a second terminal of a corresponding one of said plurality of first switches and a corresponding one of said plurality of input terminals, a first diode of each first diode pair having a polarity opposite to a second diode of the same first diode pair; and a plurality of second diode pairs, each of said second diode pairs being connected in parallel between a second terminal of a corresponding one of said plurality of second switches and said corresponding one of said plurality of input terminals, the first diode of each second diode pair having a polarity opposite to a second diode of the same second diode pair; and feedback means coupled between said bidirectional switch means and an output port of said amplifier means, for reducing conduction deviations during transmission of signals.

6. An input selection circuit, comprising:

bidirectional switch means having a plurality of input terminals connected to a plurality of input signal sources, and having a plurality of output terminals, for making a selection of and transmitting to said negative terminal an analog signal selected from among a plurality of input signal sources, the selection being based on control signals;

means having a negative terminal coupled to each of said output terminals for amplifying and providing at an output port the analog signal selected by said bidirectional switch means;

feedback means installed between each of the input terminals of said bidirectional analog switch means and said output port of said amplifying means;

said bidirectional switch means having a plurality of bidirectional switches each comprising:

first and second analog switches each responding to said control signals, the control signals being decoded by a switching control circuit; and a plurality of diodes, each of said plurality of diodes being coupled to a corresponding one of said first and second analog switches, whereby having said first analog switch in any of said plurality of bidirectional switches turned ON couples an analog signal from the corresponding signal source to a reference potential and having said second analog switch in any of said plurality of bidirectional switches turned ON couples the analog signal from the corresponding signal source to said amplifying means.

* * * * *

UNITED STATES PATENT AND TRADEMARK OFFICE
CERTIFICATE OF CORRECTION

PATENT NO. :   5,032,739
DATED      :   16 July 1991
INVENTOR(S) :  Young-san KOH It is certified that error appears in the above-identified patent and that said Letters Patent is hereby corrected as shown below:

Claim 1,   Column 6,   Line 33,   insert --responding-- after "plurality";

Line 46,   change "of each" to --each of--;

Signed and Sealed this

Ninth Day of March, 1993

*Attest:*

STEPHEN G. KUNIN

*Attesting Officer*     *Acting Commissioner of Patents and Trademarks*